United States Patent [19]

Armington et al.

[11] Patent Number: 4,576,808
[45] Date of Patent: Mar. 18, 1986

[54] QUARTZ GROWTH ON X-SEEDS

[75] Inventors: Alton F. Armington, Lexington; John J. Larkin, Methuen, both of Mass.

[73] Assignee: The United States of America as represented by the Secretary of the Air Force, Washington, D.C.

[21] Appl. No.: 566,130

[22] Filed: Dec. 28, 1983

[51] Int. Cl.⁴ ............................................. C30B 29/18
[52] U.S. Cl. ............................ 423/335; 156/DIG. 65; 156/603
[58] Field of Search .................. 156/623 Q, DIG. 65, 156/603; 423/335, 339

[56] References Cited

U.S. PATENT DOCUMENTS 3,291,575 12/1966 Sawyer ........................... 156/623 Q
3,623,847 11/1971 Gehres et al. .................. 156/623 Q
3,917,506 11/1975 Lind et al. ...................... 156/623 Q
3,976,535 8/1976 Barns ............................. 156/623 Q

OTHER PUBLICATIONS

A. F. Armington et al, J. Crystal Growth, 49 (1980) 739–742.
A. F. Armington et al, 36th Annual Frequency Control Symposium, Marriott Hotel, Phila., PA, (2–4 Jun. 1952) 55–61.

Primary Examiner—Hiram H. Bernstein
Attorney, Agent, or Firm—Donald J. Singer; Stanton E. Collier

[57] ABSTRACT

This invention concerns itself with a method for producing single crystal, seed material for use in growing synthetic quartz crystals. This seed material comprises a Z-faced seed crystal cut or sliced from the X-plus growing region of a synthetic quartz, single crystal boule.

2 Claims, 4 Drawing Figures

QUARTZ GROWTH ON X-SEEDS

STATEMENT OF GOVERNMENT INTEREST

The invention described herein may be manufactured and used by or for the Government for governmental purposes without the payment of any royalty thereon.

BACKGROUND OF THE INVENTION

This invention relates to synthetic quartz crystals. In a more particular manner, this invention concerns itself with the growth of substantially dislocation-free synthetic quartz crystals produced from substantially dislocation-free quartz seed crystals.

Quartz, chemically composed of silicon-dioxide and trace amounts of other materials such as aluminum and sodium and lithium alkalies, is one of the most abundant minerals in our geological environment. It often occurs in crystalline form and, most often, is colorless and transluscent. It's crystallized structure is either right-handed or left-handed and rotates the plane of polarization of transmitted light. One of its properties, that make it especially useful for a wide variety of industrial and military applications, is its piezoelectricity. That is, the crystal is capable of producing an electric charge on some of its surfaces when the crystal is compressed in certain directions. The charge disappears when the compression is removed. This particular property makes quartz crystals especially useful in microphones, phonograph pickups, ultrasonic generators and in electromechanical devices, such as freqency-controlling quartz crystal resonators. These quartz crystal resonators are widely used in military and commercial communication systems for carrier-frequency separation and for selecting a desired frequency signal while rejecting undesired frequencies.

Generally, the piezoelectric quartz crystals used for industrial and military applications are synthetic in nature and grown commercially using a number of conventional crystal growing techniques. One of the more successful processes employed universally for synthetic quartz growth is the so-called hydrothermal technique. It is similar in theory to the well known solution growth technique and involves growing quartz crystals under high temperatures and pressures. Nutrient, or feed material, is dissolved in a high temperature region of a vessel. The solution is transported by thermal gradients to a lower temperature region, becomes supersaturated and the material precipitates on a quartz crystal seed in single crystal form. The temperatures involved in the hydrothermal process are higher than in solution growth and pressures of 1000 atmospheres or more may be used.

In the hydrothermal process, quartz growth takes place usually in a high pressure autoclave. The interior diameter of the autoclave is between 25-35 cm and the height between 3-5 meters. The nutrient, usually natural quartz chips, also called lascas, is placed in the bottom of the autoclave and separated from the top by a baffle containing small holes. Production autoclaves often use from 100-150 kg of nutrient per run. The quartz crystal seeds are suspended on racks positioned in the upper region of the autoclave which is at a lower temperature than the bottom. Typically, there are over 100 seeds in the autoclave. Thermal insulation is placed around the outside of the autoclave. All vessels used commercially are fabricated from steel and these are often buried in the ground or enclosed in heavy metal sheets as a safety factor.

Three crucial growth parameters, pressure, temperature, and fill are interrelated in the hydrothermal process, pressure being a function of temperature and fill. The fill, i.e., the percentage of the vessel volume filled with solid and liquid prior to sealing, is generally about 80 percent. At growth temperatures, owing to thermal expansion of water, the vessel is almost entirely filled with liquid. Fill is the most important parameter determining the average autoclave pressure. A ten percent change in fill will increase the pressure more than twofold at 350° C. The fill for quartz has been varied from 65 to 88 percent corresponding to pressures of 150 to 3000 atmospheres. Most present commercial growth processes use up to 2000 atmospheres pressure.

The effect of temperature on pressure is less significant than fill, but temperature must be carefully controlled to prevent the pressure from exceeding autoclave mechanical design limits. Catastrophic failures have occurred even at commercial establishments. For alpha-quartz, the growth temperature $T_g$, near the seeds, can be varied from 200° to 573° C. At 200° the reaction is very slow but above 573° C. undesirable beta-quartz is formed. Typical growth temperatures vary from 340° to 375° C.

The temperature differential T, between the two sections of the autoclave, the top part containing the seeds and the bottom part containing the nutrient, is significant to growth rate and can be varied between 5° and 100° C. In general however, the differential depends on the growth process and desired grade. More uniform crystals are obtained with smaller temperature differentials. The proper temperature differential, profile, and schedule for constant growth rate is usually established empirically for each autoclave.

The solubility of quartz in water under hydrothermal conditions ranges from 0.1 to 0.5 weight percent. These values can be increased to the desirable level of 2-5 percent by the addition of a mineralizer solution to the nutrient solution. The mineralizer solution can be either sodium hydroxide or sodium carbonate in the range of 0.5 to 1 normal. The growth rate of quartz is slow compared to most single crystal techniques being in the range of 20 to 40 mil/day. Thus, to produce material of the desired size, growth runs can extend from 25 to over a hundred days.

The seed crystal used in hydrothermal growth is generally either a zero degree seed, correponding to the z face of the crystal, or a 5° seed, representing a plane 5° from the zero face. One of the major drawbacks of the hydrothermal process, as well as other crystal growing techniques which utilize seed crystals to propagate crystal growth, is the propagation of defects in the growing of quartz crystals boules. As stated heretofore, synthetic quartz crystals are generally grown using a seed cut perpendicular or nearly perpendicular to the Z-axis crystallographic orientation. Unfortunately, the seed crystals presently employed contain various defects which are detected by x-ray topography. These defects in the seed result in the production of dislocations during crystal growth which propagate along the axis of growth of the growing crystal. When seed crystals are then sliced from the grown crystal, the dislocations are again propagated in another growing crystal resulting in the continuing propagation of the dislocations in future runs.

Efforts are presently underway in an attempt to reduce the number of dislocations in the grown crystal by reducing the number of defects in the seed. This has been done by using select natural crystals, but it would be more economical if a technique could be found using synthetic material. Unfortunately, these previous efforts have not been too successful. With this invention, however, it has been found that quartz crystal seeds cut from the x-plus region of a quartz crystal boule can be used as seed crystals to grow substantially dislocation-free quartz. The dislocation-free quartz is especialy valuable and useful for precision timing and frequency devices.

SUMMARY OF THE INVENTION

According to the present invention, dislocation-free quartz crystal boules, which are especially valuable for use in frequency and timing device applications, can be produced by utilizing a seed crystal cut or sliced from the X-plus region of a syhthetically grown quartz boule. The seed crystal takes the form of a rectangular prism shaped slab or plate with its length directed along the crystallographic Y-axis orientation, its width directed along the X-axis orientation, and its thickness in the Z-axis orientation.

Accordingly, the primary object of this invention is to provide synthetic quartz seed crystals for use in growing substantially dislocation-free quartz crystal boules for use in timing and frequency devices.

Another object of this invention is to greatly reduce the number of dislocations and other defects in synthetic quartz grown for oscillator applications.

Still another object of this invention is to provide Z-faced quartz seed crystals cut or sliced from the X-plus growing region of a quartz crystal boule.

The above and still other objects and advantages of the present invention will become more readily apparent upon consideration of the following detailed description thereof when view in conjunction with the accompanying drawing.

DETAILED DESCRIPTION OF THE PREFERRED EMBODIMENT

Figure 1:
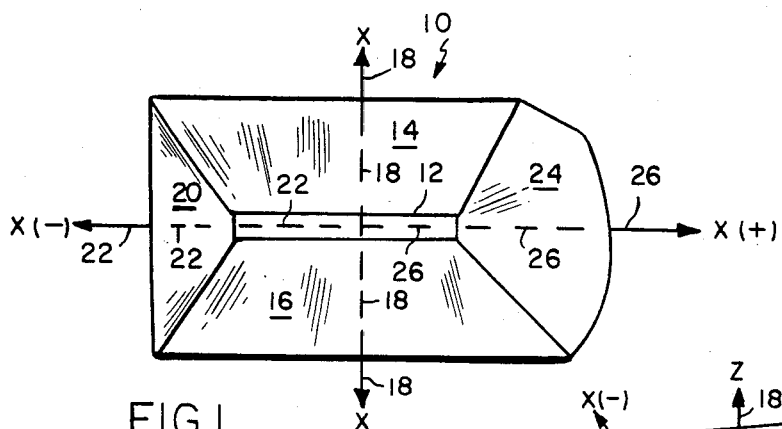
FIG. 1 represents a cross-sectional view of a synthetic quartz crystalline boule.

Pursuant to the above-defined objects, it has been found that dislocation-free, or substantially dislocation-free synthetic quartz, single crystal boules can be grown by utilizing a synthetic quartz seed crystal having a Z-face and being cut from the X-plus region of a synthetic quartz boule. Heretofore, seed crystals having a Z-face, which runs in the direction perpendicular to the crystallographic Z-axis orientation of the crystal, were sliced or cut out of both the X and Z portions of the crystal boule for subsequent use as a seed crystal for growing additional boules. The use of such crystals lead to the propagation of a large number of dislocations in the boule, thus limiting its subsequent utlization for critical military applications.

Dislocation-free quartz crystals are needed for the fabrication of precision oscillators for numerous military frequency and timing applications. Presently, natural quartz seeds produce the best material in this regard. However, only exceptional grade material can be used and the selection process for this material is time consuming and expensive. Conversely, the use of the X-plus seeds of this invention is exceedingly inexpensive, since X-plus material is usually discarded during processing. In addition, better totally dislocation-free material is produced using the X-plus seed.

Dislocations produced from these seeds (cut from the X-plus region) during subsequent crystal growth propagate at right angles to the growth direction and disappear rather than propagating into the growing crystal. The Z-growth region of the growing crystals, used for precision oscillators, is thus free of dislocations which are harmful to the oscillator. That is, the dislocations in the X-plus growth area do not propagate in the Z direction but in a direction at a low angle to the Z face. Thus, dislocations from these seeds propagate away from the growing direction and out of the crystal. In attempting to solve the problems of dislocation, other methods such as sweeping the seed in air or moderate vacuum, or etching the seed, were not successful in decreasing dislocation density. However, as was found, the use of a Z-face seed sliced from the X-plus growth area did result in a lower dislocation density in the crystal. The analytical results for a sample grown from this type seed are shown in Table I where they are compared with the average impurity on silver lined runs. The material is at least as pure as material grown from other seeds. A semiquantitative measurement of the optical Q indicates a value of Q equal to 2.3 million. Preliminary etching studies on the X-plus crystal indicates a lower value for the dislocation density. A-Z seed crystal in the same autoclave had an average density of 54 to 57 channels per square cm, while the X-plus seed crystal density was 17 to 23 per square cm. The average value includes the crystal over the seed area with saw damage which increased the dislocation density. In areas away from this damage, the density was about 3 per square centimeter.

TABLE I

| Purity of Crystals with X-plus growth seeds (AA-PPMA) | | | | | |
|---|---|---|---|---|---|
| | AL | Fe | Li | Na | K |
| Z seed | 2.9 | 1.3 | 1.2 | 1.5 | 1.2 |
| X(+) seed | 5(1.1)* | — | 0.5 | 11 | 0.6 |

*Al by EPR

As was stated heretofore, the intent of this invention is to develope a seed crystal for use in greatly reducing the number of dislocations and other defects in synthetic quartz boules grown for oscillator applications. The invention will be more readily understood by referring to the drawings.

Referring now to FIG. 1 of the drawings, there is disclosed, in cross-ection, a synthetic quartz single crystal boule 10 cut perpendicular to the Y-axis orientation and further showing a crystal seed slab 12 positioned in the center of the boule 10. The cross-sectional view of FIG. 1 addressed the problem of propagating dislocations in the growing of quartz boules by disclosing four regions of crystal growth. Two equivalent regions 14 and 16 are positioned directly above and below the seed slab 12. These two regions represent growth in the direction of the Z axis, which is indicated by solid and dotted line 18, and define the Z region of growth the crystal boule 10. A region of slower growth 20 occurs toward the X-minus axis, which is indicated by solid and dotted line 22 and defines the X-minus region of growth. A last region 24 is somewhat more rapid in growth and growth proceeds along the X-plus axis, which is indicated by solid and dotted line 26, and defines the X-plus region of growth. This invention specifically concerns itself with the X-plus region of growth since it is from this specific area that the seed slab of this invention is sliced to produce the highest perfection material which is substantially free of dislocations.

Figure 2:
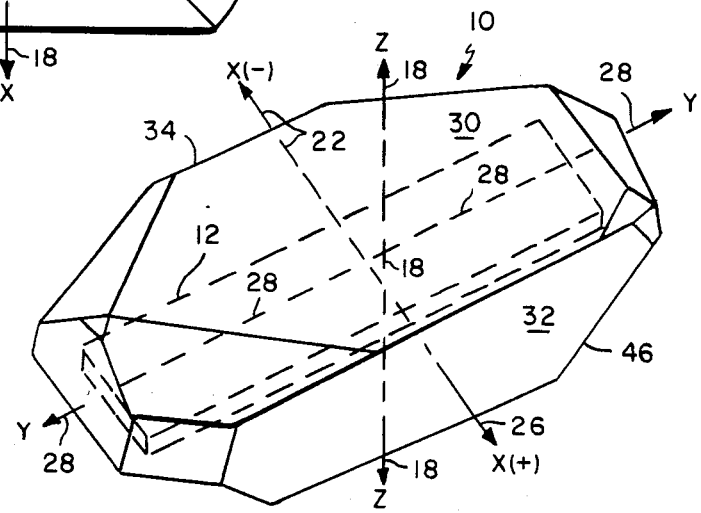
FIG. 2 represents a perspective view of the crystalline boule of FIG. 1.

FIG. 2 discloses an isometric view of the crystal boule 10 of FIG. 1 and the positions of the X-plus axis 26, X-minus axis 22, the Z-axis 18 and the Y-axis which is indicated by the solid and dotted line 28. FIG. 2 also discloses the position of the boule's oppositely disposed and parallel Z faces 30 and 46, X-plus face 32 and the X-minus face 34 which is oppositely disposed and in parallel relationship to X-plus face 32.

Figure 3:
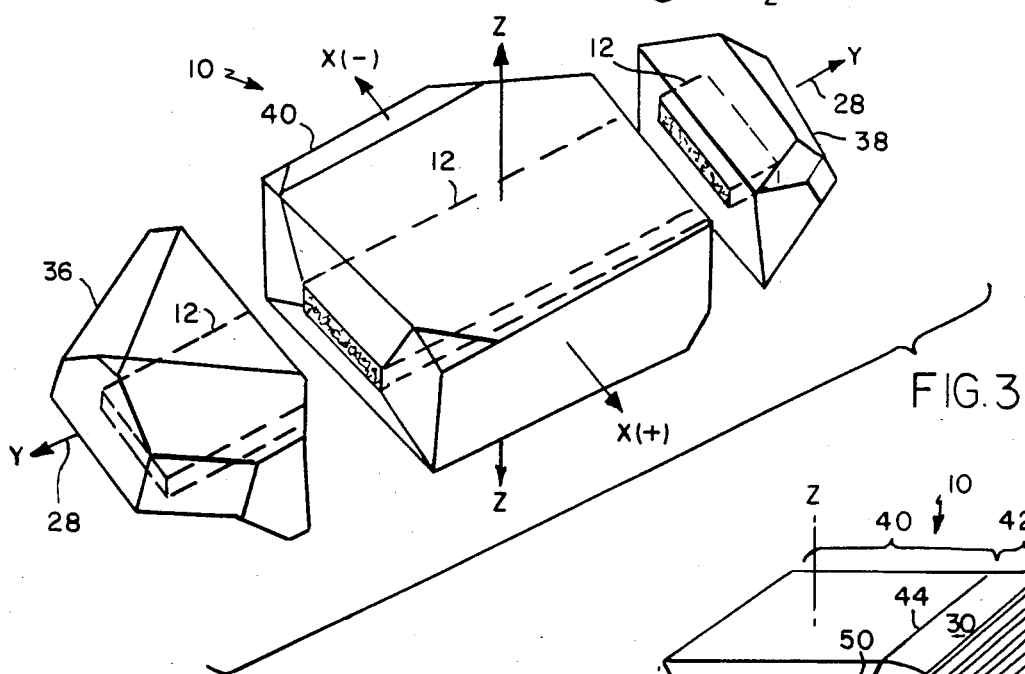
FIG. 3 is a cut-away view, in perspective, of the crystalline boule of FIG. 2 showing the end portions removed.

FIG. 3 discloses a cut-away version of the boule 10 in which the end portions 36 and 38 are removed. The main central portion 40 remains and is used for slicing and fabrication of the seed crystal slabs of this invention.

Figure 4:
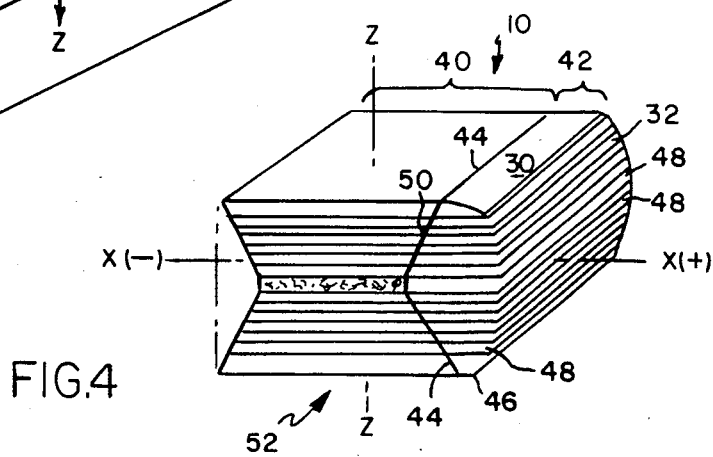
FIG. 4 is a schematic view illustrating crystal seed slabs sliced from the crystalline boule of FIG. 3.

As shown in FIG. 4, a portion 42 is cut along edge line 44 from the X-plus region 24 of the main portion 40. The portion 42 is then removed from central portion 40 and prepared for slicing. Seed slabs 48 are then sliced from portion 42 using a diamond saw such that the individual seed slabs possess two oppositely disposed Z-faces 30 and 46 running perpendicular to the Z axis orientation, a natural X-plus face 32 and an oppositely disposed face 50 determined by the edge line 44. For purposes of illustration, FIG. 4 also shows Z-faced seed slabs 52 cut from the Z and X-minus regions 14, 16 and 20 as is common in commercial practice.

From a consideration of the aforementioned, it can be seen that the present invention provides synthetic quartz crystal seed slabs that possess a minimum of dislocations and defects. The absence of dislocations enhance the utility of the seed slabs of this invention in the production of synthetic quartz boules for use in oscillator applications, especially for military purposes which require highly accurate and dependable devices.

While the invention has been described with particularity in reference to a specific embodiment thereof, it is to be understood that the disclosure of the present invention is made for the purpose of illustration only and is not intended to be limiting of the invention in any way, the scope of which is defined by the appended claims.

What is claimed is:

1. A method for producing a substantially dislocation-free crystal seed material for use in the growing synthetic quartz, single crystal boules which comprises the steps of:
   (A) providing a synthetic quartz, single crystal boule with its length directed along a crystallographic Y-axis orientation, its width directed along a crystallographic Y-axis orientation, its thickness directed along a crystallographic Z-axis orientation and wherein said Z-axis defines a Z region of crystal growth and said X-axis defines an X-minus and an X-plus region of crystal growth;
   (B) slicing and removing the X-plus region of growth from said crystal boule;
   (C) slicing a plurality of seed crystals from said X-plus region of growth such that each of said seed crystals displays a substantially rectangular prism configureation having (1) two oppositely disposed and parallel Z face surfaces running perpendicular to the Z axis orientation and along the longitudinal direction of the rectangular prism, (2) a first edge surface running perpendicular to the X-plus axis orientation and along the longitudinal thickness of the rectangular prism, (3) a second edge surface oppositely disposed and parallel to said first edge surface running perpendicular to the X-minus axis orientation, and (4) third and fourth oppositely disposed and parallel edge surfaces defining the longitudinal dimension of said rectangular prism and running in a direction perpendicular to said crystallographic Y-axis orientation.

2. The crystal seed material produced by the method of claim 1.

* * * * *